(12) United States Patent
Cao et al.

(10) Patent No.: US 10,665,794 B2
(45) Date of Patent: May 26, 2020

(54) FLEXIBLE DISPLAY PANEL AND FLEXIBLE DISPLAY DEVICE

(71) Applicant: Wuhan China Star Optoelectronics Semiconductor Display Technology Co., Ltd., Wuhan, Hubei (CN)

(72) Inventors: Haoran Cao, Hubei (CN); Pilgeun Chun, Hubei (CN)

(73) Assignee: WUHAN CHINA STAR OPTOELECTRONICS SEMICONDUCTOR DISPLAY TECHNOLOGY CO., LTD., Wuhan, Hubei (CN)

(*) Notice: Subject to any disclaimer, the term of this patent is extended or adjusted under 35 U.S.C. 154(b) by 0 days.

(21) Appl. No.: 16/230,651

(22) Filed: Dec. 21, 2018

(65) Prior Publication Data

US 2020/0028101 A1    Jan. 23, 2020

Related U.S. Application Data

(63) Continuation of application No. PCT/CN2018/104471, filed on Sep. 7, 2018.

(30) Foreign Application Priority Data

Jul. 19, 2018    (CN) .......................... 2018 1 0793537

(51) Int. Cl.
*H01L 29/08* (2006.01)
*H01L 51/00* (2006.01)
(Continued)

(52) U.S. Cl.
CPC ...... *H01L 51/0097* (2013.01); *H01L 51/5012* (2013.01); *H01L 51/5221* (2013.01);
(Continued)

(58) Field of Classification Search
CPC ............. H01L 51/0097; H01L 51/5012; H01L 51/5221; H01L 51/5237; H01L 51/5271; H01L 51/5281
(Continued)

(56) References Cited

U.S. PATENT DOCUMENTS 10,211,416 B2* 2/2019 Jin ...................... H01L 51/0097
2014/0145161 A1* 5/2014 Naijo .................. H01L 51/0097
257/40

FOREIGN PATENT DOCUMENTS

CN          1612009 A      5/2005
CN        105932036 A      9/2016

* cited by examiner

*Primary Examiner* — Tan N Tran
(74) *Attorney, Agent, or Firm* — Leong C. Lei

(57) ABSTRACT

Provided are a flexible display panel and a flexible display device. The flexible display panel includes a substrate, comprising a first region, a second region and a bent region for connecting the first region and the second region; a first display area disposed on the first region; a second display area disposed on the second region; a reflectivity of the second display area is greater than a reflectivity of the first display area. The reflectivities of the first display area and the second display area in the flexible display panel are configured to be different. The reflectivity of the second display area is greater than the reflectivity of the first display area. When the second display area is not lighted, a mirror display effect can be achieved, and the functions and application scopes of the flexible display panel and the flexible display device are expanded.

7 Claims, 2 Drawing Sheets

(51) Int. Cl.
*H01L 51/52* (2006.01)
*H01L 51/50* (2006.01)
(52) U.S. Cl.
CPC ...... *H01L 51/5237* (2013.01); *H01L 51/5271* (2013.01); *H01L 51/5281* (2013.01)
(58) Field of Classification Search
USPC ...................................... 257/40, 59, 72, 432
See application file for complete search history.

FLEXIBLE DISPLAY PANEL AND FLEXIBLE DISPLAY DEVICE

CROSS-REFERENCE TO RELATED APPLICATION

This application is a continuing application of PCT Patent Application No. PCT/CN2018/104471 entitled "Flexible display panel and flexible display device", filed on Sep. 7, 2018, which claims priority to Chinese Patent Application No. 201810793537.6, filed on Jul. 19, 2018, both of which are hereby incorporated in its entireties by reference.

FIELD OF THE INVENTION

The present invention relates to a screen display field, and more particularly to a flexible display panel and a flexible display device.

BACKGROUND OF THE INVENTION

As the development of technology progresses, so does the demand for panel displays. OLEDs have been widely utilized for advantages of wide color gamut, high contrast, wide viewing angle and flexibility. The application of double-sided OLED display devices is becoming more and more widespread.

The existing double-sided OLED display device is configured to connect two display screens through a bending zone, and the two display screens respectively show corresponding images outward, which compensate the shortcoming of the traditional single-sided OLED display device which can only show images on one side. However, when the two screens are not lighted to show the images, there is no other function, which limits the scope of application.

SUMMARY OF THE INVENTION

An objective of the present invention is to provide a flexible display panel and a flexible display device, in which one display screen can be used as a mirror as being not lighted to expand functions and application scopes.

For solving the aforesaid issues, the present invention provides a flexible display panel, comprising:

a substrate, comprising a first region, a second region and a bent region for connecting the first region and the second region;

a first display area disposed on the first region;

a second display area disposed on the second region;

a reflectivity of the second display area is greater than a reflectivity of the first display area.

The first display area comprises a first organic light emitting diode layer and a first encapsulation layer; and the first organic light emitting diode layer comprises a first cathode layer;

the second display area comprises a second organic light emitting diode layer and a second encapsulation layer, and the second organic light emitting diode layer comprises a second cathode layer.

A thickness of the second cathode layer is greater than a thickness of the first cathode layer.

The thickness of the second cathode layer is 500 to 2000 angstroms.

A first reflective layer is disposed on the first encapsulation layer, and a second reflective layer is disposed on the second encapsulation layer, and a reflectivity of the second reflective layer is greater than a reflectivity of the first reflective layer.

The first reflective layer is a polarizer, and the second reflective layer is a metal silver layer having a single-layer structure or a multi-layer structure.

The bent region comprises a polyimide layer and an array layer, which are laminated.

The first display area and the second display area show images in opposite directions.

An area of the first display area is greater than or equal to an area of the second display area.

The present invention further provides a flexible organic light emitting diode display device, comprising a flexible display panel and a frame for mounting the flexible display panel, wherein the flexible display panel comprises:

a substrate, comprising a first region, a second region and a bent region for connecting the first region and the second region;

a first display area disposed on the first region;

a second display area disposed on the second region;

a reflectivity of the second display area is greater than a reflectivity of the first display area.

The benefits of the present invention are: the reflectivities of the first display area and the second display area in the flexible display panel are configured to be different. The reflectivity of the second display area is greater than the reflectivity of the first display area. When the second display area is not lighted, a mirror display effect can be achieved, and the functions and application scopes of the flexible display panel and the flexible display device are expanded. When the second display area is lighted, the screen can be displayed as normal as the first display area. Besides, for further enhancing the mirror display effect, the second cathode layer of the second display area is further thickened to have the thickness greater than the thickness of the first cathode layer of the first display area.

BRIEF DESCRIPTION OF THE DRAWINGS

In order to more clearly illustrate the embodiments of the present invention or prior art, the following figures will be described in the embodiments are briefly introduced. It is obvious that the drawings are merely some embodiments of the present invention, those of ordinary skill in this field can obtain other figures according to these figures without paying the premise.

DETAILED DESCRIPTION OF PREFERRED EMBODIMENTS

The following descriptions for the respective embodiments are specific embodiments capable of being implemented for illustrations of the present invention with referring to appended figures.

Figure 1:
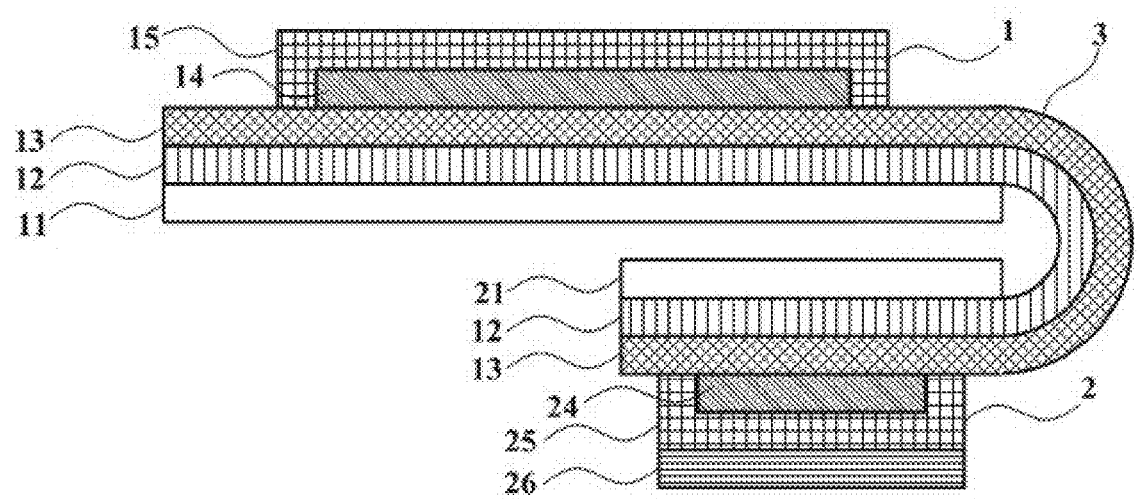
FIG. 1 is a structural diagram of a flexible display panel according to the first embodiment of the present invention.

Please refer to FIG. 1, The first embodiment of the present invention provides a flexible display panel, comprising:

a substrate, comprising a first region, a second region and a bent region for connecting the first region and the second region;

a first display area 1 disposed on the first region;

a second display area 2 disposed on the second region;

a reflectivity of the second display area 2 is greater than a reflectivity of the first display area 1.

In this embodiment; the reflectivities of the first display area 1 and the second display area 2 in the flexible display panel are configured to be different. The reflectivity of the second display area 2 is greater than the reflectivity of the first display area 1. When the second display area 2 is not lighted, a mirror display effect can be achieved so that the second display area 2 looks like a mirror, and the functions and application scopes of the flexible display panel and the flexible display device are expanded.

Figure 2:
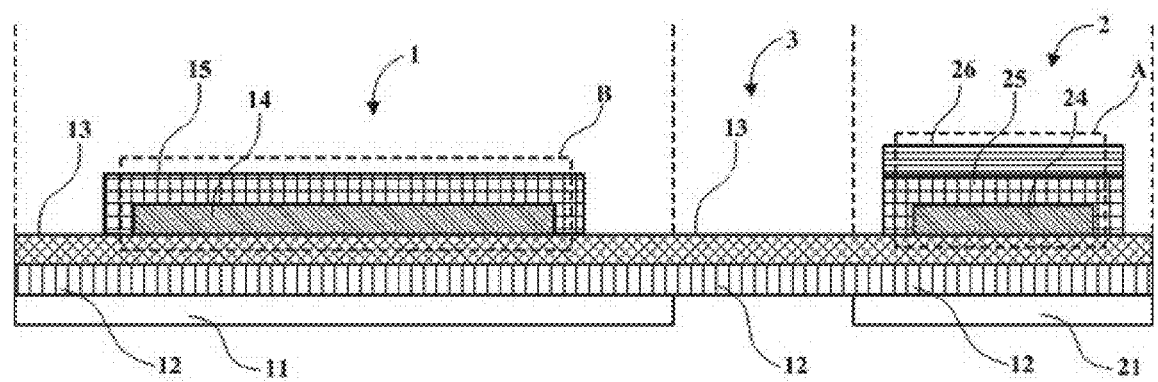
FIG. 2 is an exploded view structural diagram of a flexible display panel according to the first embodiment of the present invention.

Please refer to FIG. 2. In the flexible display panel of this embodiment, a polyimide layer 12 is adopted instead of the glass in the LCD panel, and an array process is performed thereon, and a back plate (BP) 11 is adhered under the polyimide layer 12. A material of the back plate 11 is a PET (polyethylene terephthalate), which can improve the rigidity of the organic light emitting diode display to prevent the display screen from being too soft, and to make the display screen have a certain degree of flexibility at the same time. In the production, the array layer 13 is prepared on the polyimide layer 12, which the back plate 11 is attached. The array layer 13 serves as a thin film transistor array substrate for controlling light emission of the upper organic light emitting diode layer. According to design requirements, the OLED layer and the encapsulation layer are further formed in a predetermined area. The OLED layer functions as an organic light emitting layer to realize light emission of the pixel; the role of the encapsulation layer is to encapsulate the light emitting layer to prevent moisture from damaging the material and element of the light emitting layer. As an example, the encapsulation layer of this embodiment is a Thin Film Encapsulation (TFE). Specifically, the first OLED layer 14 and the first thin film encapsulation layer 15 are formed on the array layer 13 of the first display area 1. The second OLED layer 24 and the second thin film encapsulation layer 25 are formed on the array layer 13 of the second display area 2, and a reflective layer 26 is formed on the second thin film encapsulation layer 25, Specifically, the reflective layer 26 is a metal silver layer (Ag) of a single layer or a multi-layer, which can be formed by deposition or evaporation. The reflective layer 26 can reflect external light, and the reflectivity of the second display area 2 is increased, and the reflectivity of the second display area 2 is greater than the reflectivity of the first display area 1.

To facilitate bending, the back plate 11 under the polyimide layer 12 is removed in the bent region 3, and only the polyimide layer 12 and the array layer 13 are reserved, so that the bent region 3 is made thinner, thereby the first back plate 11 and a second back plate 21 are formed, respectively.

The first display area 1 and the second display area 2 are positioned in different planes by bending in the bent region 3, and the specific bent angle is determined according to the actual needs, which is not limited in this embodiment. As one embodiment, as shown in FIG. 1, the first display area 1 and the second display area 2 show images in opposite directions. Specifically, the first display area 1 includes a first back plate 11, a polyimide layer 12, an array layer 13, a first OLED layer 14 and a first thin film encapsulation layer 15 from bottom to top in sequence to show images upwards; the second display area 2 includes a second back plate 21, a polyimide layer 12, an array layer 13, a second OLED layer 24, a second thin film encapsulation layer 25 and a reflective layer 26 from bottom to top in sequence to show images downwards. Meanwhile, the size relationship between the first display area 1 and the second display area 2 depends on the application scenario and actual requirements. Generally, the area of the first display area 1 is greater than or equal to the area of the second display area 2.

Figure 3:
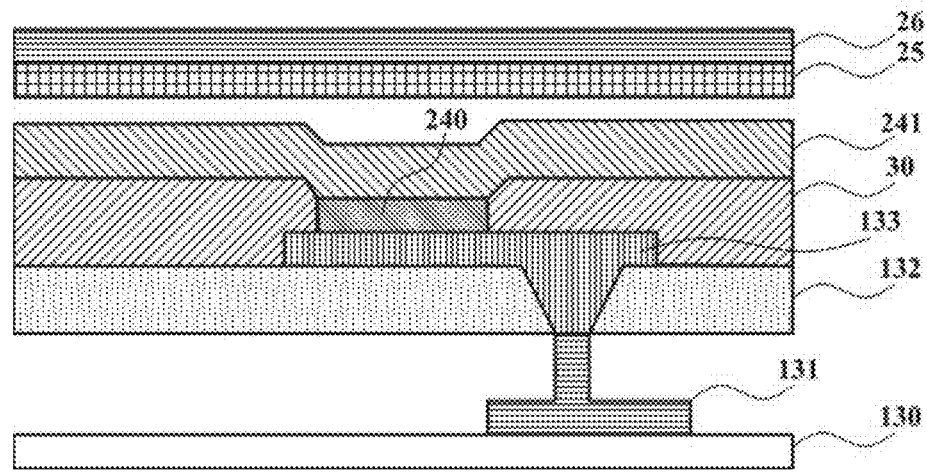
FIG. 3 is a specific structural diagram of a portion of broken line frame A in the second display area shown in FIG. 2.

Please refer to FIG. 3, again, which is a specific structural diagram of a portion of broken line frame A in the second display area 2 shown in FIG. 2. The array layer 13 includes a buffer layer 130, a thin film transistor (TFT) 131 disposed on the buffer layer 130, a planarization layer 132 disposed on the thin film transistor 131 and an anode 133 disposed on the planarization layer 132 and connected to the thin film transistor 131 through a contact hole. The second OLED layer 24 includes a plurality of light emitting sub-pixels 240. Each of light emitting sub-pixels 240 is separated by a pixel definition layer (PDL) 30 disposed on the anode 133 and the planarization layer 132 to prevent color mixture. A second cathode layer 241 is disposed on a pixel definition layer 30 and the light emitting sub-pixel 240. The main component of the second cathode layer 241 is a metal, such as magnesium (Mg) or silver (Ag). If the second cathode layer 241 is thickened, the second display area 2 can exhibit a mirror-like effect when the light emitting sub-pixel 240 does not emit light and can be normally displayed when the light emitting sub-pixel 240 emits light. Besides, in this embodiment, except providing the reflective layer 26 on the second thin film encapsulation layer 25 of the second display area 2, for further enhancing the mirror effect of the second display area 2, the second cathode layer 241 is further thickened, and the thickness thereof is 500 to 2000 angstroms.

Figure 4:
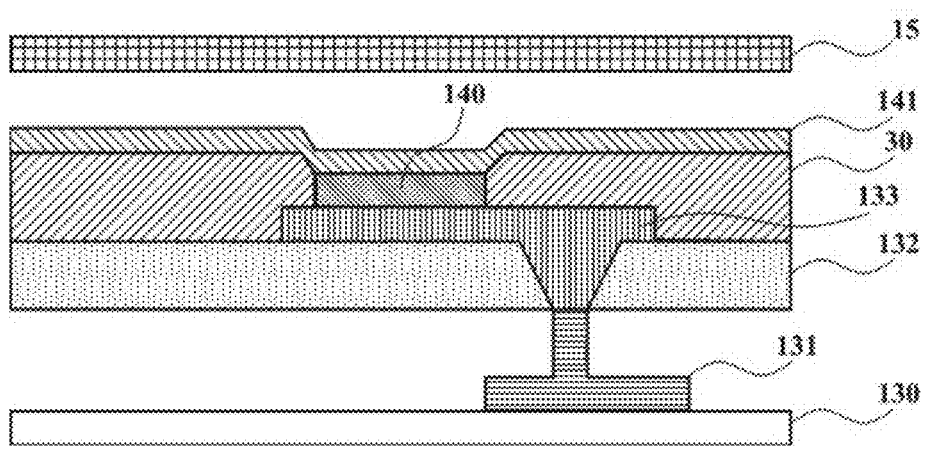
FIG. 4 is a specific structural diagram of a portion of broken line frame B in the first display area shown in FIG. 2.

FIG. 4 is a specific structural diagram of a portion of broken line frame B in the first display area 1 shown in FIG. 2. The array layer 13 includes a buffer layer 130, a thin film transistor 131 disposed on the buffer layer 130, a planarization layer 132 disposed on the thin film transistor 131 and an anode 133 disposed on the planarization layer 132 and connected to the thin film transistor 131 through a contact hole. The first OLEO layer 14 includes a plurality of light emitting sub-pixels 140. Each of light emitting sub-pixels 140 is separated by a pixel definition layer 30 disposed on the anode 133 and the planarization layer 132 to prevent color mixture. A first cathode 141 is disposed on the pixel definition layer 30 and the light emitting sub-pixel 140. Since the first display area 1 does not need to exhibit a mirror display effect, the first cathode layer 141 may be formed according to a usual process. The first cathode layer 141 does not need to be thickened. Namely, the thickness of the second cathode layer 241 is greater than the thickness of the first cathode layer 141.

In other implementations, the first encapsulation layer 15 is provided with a first reflective layer, and the second encapsulation layer 25 is provided with a second reflective layer. The reflectivity of the second reflective layer is greater than the reflectivity of the first reflective layer. As one illustration, the first reflective layer is a polarizer, and the second reflective layer is a metal silver layer having a single-layer structure or a multi-layer structure, or a metal aluminum layer having a single-layer structure or a multi-layer structure.

Figure 5:
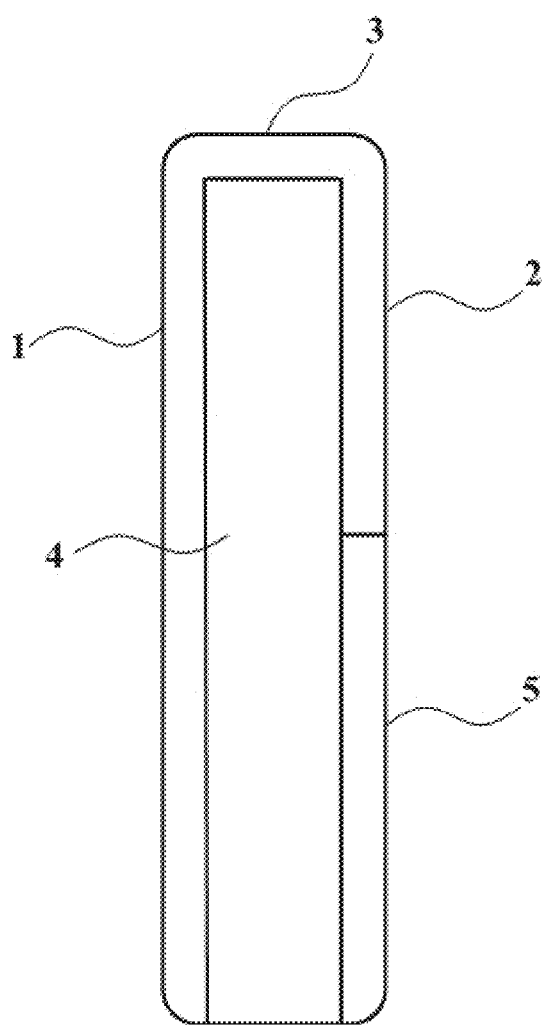
FIG. 5 is a diagram of an external shape of a flexible display device according to the second embodiment of the present invention.

Please refer to FIG. 5. In accordance with the flexible display panel according to the first embodiment of the present invention, the second embodiment of the present invention provides a flexible display device, including the flexible display panel according to the first embodiment of the present invention and a frame 4 for mounting the flexible display panel. A specific application of the foregoing flexible display device is a double-sided screen mobile phone. The first display area 1 serves as a main screen, and the second display area 2 serves as a sub-screen. The sub-screen can achieve the mirror display effect when it is not lighted to provide consumers with functions other than showing images. The first display area 1 and the second display area 2 are mounted on two sides of the frame 4, and show images in opposite directions (leftward and rightward as shown in FIG. 5). The first display area 1 serves as a main screen, and the second display area 2 serves as a sub-screen. The bent region 3 is located at the top of the frame 4 and connects the first display area 1 and the second display area 2. Obviously, the area of the first display area 1 is greater than the area of the second display area 2. A back shell or a physical keyboard 5 is mounted below the second display area 2.

With the aforesaid description, the benefits of the embodiments of the present invention are: the reflectivities of the first display area and the second display area in the flexible display panel are configured to be different. The reflectivity of the second display area is greater than the reflectivity of the first display area. When the second display area is not lighted, a mirror display effect can be achieved, and the functions and application scopes of the flexible display panel and the flexible display device are expanded. When the second display area is lighted, the screen can be displayed as normal as the first display area. Besides, for further enhancing the mirror display effect, the second cathode layer of the second display area is further thickened to have the thickness greater than the thickness of the first cathode layer of the first display area.

Above are embodiments of the present invention, which does not limit the scope of the present invention. Any equivalent amendments within the spirit and principles of the embodiment described above should be covered by the protected scope of the invention.

What is claimed is:

1. A flexible display panel, comprising:
a substrate, comprising a first region, a second region and a bent region for connecting the first region and the second region;
a first display area disposed on the first region;
a second display area disposed on the second region;
a reflectivity of the second display area is greater than a reflectivity of the first display area;
wherein the first display area comprises a first organic light emitting diode layer and a first encapsulation layer, and the first organic light emitting diode layer comprises a first cathode layer; the second display area comprises a second organic light emitting diode layer and a second encapsulation layer, and the second organic light emitting diode layer comprises a second cathode layer;
wherein a thickness of the second cathode layer is greater than a thickness of the first cathode layer.

2. The flexible display panel according to claim 1, wherein the thickness of the second cathode layer is 500 to 2000 angstroms.

3. The flexible display panel according to claim 1, wherein a first reflective layer is disposed on the first encapsulation layer, and a second reflective layer is disposed on the second encapsulation layer, and a reflectivity of the second reflective layer is greater than a reflectivity of the first reflective layer.

4. The flexible display panel according to claim 3, wherein the first reflective layer comprises a polarizer, and the second reflective layer is a metal silver layer having a single-layer structure or a multi-layer structure, or a metal aluminum layer having a single-layer structure or a multi-layer structure.

5. The flexible display panel according to claim 1, wherein the bent region comprises a polyimide layer and an array layer, which are laminated.

6. The flexible display panel according to claim 1, wherein the first display area and the second display area show images in opposite directions.

7. The flexible display panel according to claim 6, wherein an area of the first display area is greater than or equal to an area of the second display area.

* * * * *